United States Patent
Joshi et al.

(10) Patent No.: US 11,545,874 B2
(45) Date of Patent: *Jan. 3, 2023

(54) THERMAL MANAGEMENT ASSEMBLIES FOR ELECTRONIC ASSEMBLIES CIRCUMFERENTIALLY MOUNTED AROUND A MOTOR USING A FLEXIBLE SUBSTRATE

(71) Applicant: TOYOTA MOTOR ENGINEERING & MANUFACTURING NORTH AMERICA, Inc., Plano, TX (US)

(72) Inventors: Shailesh N. Joshi, Ann Arbor, MI (US); Shohei Suenaga, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 464 days.

This patent is subject to a terminal disclaimer.

(21) Appl. No.: 16/719,264

(22) Filed: Dec. 18, 2019

(65) Prior Publication Data
US 2021/0194323 A1    Jun. 24, 2021

(51) Int. Cl.
*H02K 9/00* (2006.01)
*H01L 23/373* (2006.01)
(Continued)

(52) U.S. Cl.
CPC ............ *H02K 9/00* (2013.01); *H01L 23/367* (2013.01); *H01L 23/3736* (2013.01);
(Continued)

(58) Field of Classification Search
CPC ........ H02K 9/00; H02K 9/04; H02K 2209/00; H02K 11/00; H02K 5/22; H05K 1/0201;
(Continued)

(56) References Cited

U.S. PATENT DOCUMENTS

| 9,707,948 B2 | 7/2017 | Bourlon |
| 2005/0194851 A1* | 9/2005 | Eckert ................... H02K 3/522 310/71 |

(Continued)

FOREIGN PATENT DOCUMENTS

| JP | 2004153897 A | * | 5/2004 |
| JP | 2004153897 A |   | 5/2004 |
| JP | 6408857 B2   |   | 10/2018 |

OTHER PUBLICATIONS

English Translation of JP20041533897 (Year: 2004).*

*Primary Examiner* — Zachary Pape
*Assistant Examiner* — Amir A Jalali
(74) *Attorney, Agent, or Firm* — Dinsmore & Shohl LLP

(57) ABSTRACT

An electronic assembly includes a flexible printed circuit board (PCB) circumferentially disposed around a motor and a thermal management assembly (TMA) thermally connected to the flexible PCB. One or more switching semiconductor devices are disposed on a first surface of the flexible PCB. The TMA includes a cooling jacket, at least one jacket manifold formed through the cooling jacket and a thermal compensation base layer thermally coupled to the cooling jacket. The cooling jacket is mounted around a circumference of the motor and has a mounting surface concentric with the circumference of the motor. The mounting surface is coupled to the first surface of the flexible PCB. The at least one jacket manifold has a fluid inlet and a fluid outlet defining a fluid flow area therebetween. The thermal compensation base layer is thermally coupled to the cooling jacket and the one or more switching semiconductor devices.

19 Claims, 6 Drawing Sheets

(51) Int. Cl.
*H05K 1/11* (2006.01)
*H05K 7/20* (2006.01)
*H01L 23/367* (2006.01)

(52) U.S. Cl.
CPC .......... *H05K 1/118* (2013.01); *H05K 7/2089* (2013.01); *H02K 2209/00* (2013.01)

(58) Field of Classification Search
CPC ...... H05K 1/0203–0204; H05K 1/0271–0272; H05K 1/028; H05K 1/118; H05K 1/147; H05K 1/189; H05K 1/0272; H05K 7/20; H05K 7/2039; H05K 7/20454; H05K 7/2089; H05K 7/20254–20272; H05K 7/20927; H05K 2201/051; H05K 2201/064; H05K 2201/066; H05K 2201/10166; H01L 21/56; H01L 23/12; H01L 23/16; H01L 23/3121; H01L 23/34–3731; H01L 23/3736; H01L 23/473; H01L 2224/32225; H01L 2224/291; H01L 25/07; H01L 25/18; H01L 29/00; H01H 9/52; F28D 15/00; F28D 9/00; F28F 3/00; F28F 3/06; F28F 7/00; H01M 4/66

See application file for complete search history.

(56) References Cited

U.S. PATENT DOCUMENTS

| | | |
|---|---|---|
| 2008/0044175 A1* | 2/2008 | Ilkawa .................. H05K 1/028 |
| | | 396/542 |
| 2008/0185924 A1 | 8/2008 | Masoudipour et al. |
| 2014/0354118 A1 | 12/2014 | Schwarz et al. |
| 2018/0288907 A1 | 10/2018 | Ricards |
| 2019/0222018 A1 | 7/2019 | Reiter et al. |
| 2019/0252949 A1 | 8/2019 | Woody et al. |
| 2020/0076263 A1* | 3/2020 | Morita .................... H01F 5/003 |
| 2021/0014958 A1* | 1/2021 | Joshi .................... H05K 1/0203 |

* cited by examiner

THERMAL MANAGEMENT ASSEMBLIES FOR ELECTRONIC ASSEMBLIES CIRCUMFERENTIALLY MOUNTED AROUND A MOTOR USING A FLEXIBLE SUBSTRATE

TECHNICAL FIELD

The present specification generally relates to cooling structures for electronic assemblies and, more specifically, to thermal management assemblies for cooling electronic assemblies circumferentially mounted around a motor using a flexible substrate.

BACKGROUND

As electronic assemblies are designed to operate at increased power levels, they generate high heat flux due to the demands of electrical systems. This means that the printed circuit board (PCB) and the active and passive components disposed on the PCB in the electronic assembly should be able to withstand higher temperatures and thermally induced stresses. Conventional heat sinks may be unable to adequately remove sufficient heat to effectively lower the operating temperature of the electronic assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the overall electronic assemblies and make their thermal management challenging.

Further, due to technological advancement over the years, insulated gate bipolar transistors (IGBTs) have become the chosen power electronic device in electronic assemblies for a wide range of industrial power conversion applications, such as inverters used in electrified vehicles. The packaging technology for commercial IGBTs is based on wire-bonding technology used to connect dies and terminal leads. Stray inductance is a major concern in the design and layout of IGBT packages and power stages with both high switching speed and high power handling requirements. Moreover, since the power electronic device(s) and the gate drive device(s) used to control them are separate modules within the packaged power conversion assembly, the package design has an undesirably large size and suffers from parasitic inductance. Accordingly, compact electronic assemblies having both power electronic device(s) and gate drive device(s) integrated with thermal management assemblies for cooling the electronic assemblies may be desirable.

SUMMARY

The present specification relates to thermal management assemblies for cooling electronic assemblies circumferentially mounted around a motor using a flexible substrate. In one embodiment, a thermal management assembly for cooling an electronic assembly on a flexible printed circuit board circumferentially disposed around a motor is disclosed. The thermal management assembly includes a cooling jacket, at least one jacket manifold formed through the cooling jacket and a thermal compensation base layer thermally coupled to the cooling jacket. The cooling jacket is configured to be mounted around a circumference of the motor and has a mounting surface concentric with the circumference of the motor. The at least one jacket manifold has a fluid inlet and a fluid outlet defining a fluid flow area therebetween. The thermal compensation base layer is configured to thermally connect the cooling jacket and one or more devices on the flexible printed circuit board.

In another embodiment, an electronic assembly is disclosed. The electronic assembly includes a flexible printed circuit board circumferentially disposed around a motor and having a first surface and a second surface opposite to the first surface. One or more switching semiconductor devices are disposed on the first surface. The electronic assembly further includes a thermal management assembly thermally connected to the flexible printed circuit board. The thermal management assembly includes a cooling jacket, at least one jacket manifold formed through the cooling jacket and a thermal compensation base layer thermally coupled to the cooling jacket. The cooling jacket is mounted around a circumference of the motor and has a mounting surface concentric with the circumference of the motor. The mounting surface is coupled to the first surface of the flexible printed circuit board. The at least one jacket manifold has a fluid inlet and a fluid outlet defining a fluid flow area therebetween. The thermal compensation base layer is thermally coupled to the cooling jacket and the one or more switching semiconductor devices disposed on the first surface of the flexible printed circuit board.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments described herein are directed to thermal management assemblies for cooling electronic assemblies circumferentially mounted around a motor using a flexible substrate. The thermal management assemblies are thermally connected to a printed circuit board (PCB) on which the electronic assemblies comprising active and passive components are disposed. As used herein, the term "active component" is defined as a component that can electrically control current by means of an electrical signal and introduce energy when placed in an electrical/electronic circuit, while the term "passive component" is defined as a component that cannot electrically control current and hence does not introduce energy when placed in an electrical/electronic circuit.

The thermal management assemblies described herein are configured to remove heat generated by the switching semiconductor devices during the operation of an integrated electronic assembly circumferentially mounted around a motor using the flexible substrate. The integrated electronic assembly includes the flexible substrate, on which both the power electronic device(s) and the gate drive device(s) used to control them, are disposed. The thermal management assemblies remove heat during operation of the integrated electronic assembly through the use of a thermal compensation base layer thermally connecting the power electronic device(s) and a cooling jacket mounted around a circumference of the motor, as well as a cooling fluid flowing through a jacket manifold within the cooling jacket. Various other aspects of the disclosure and variations thereof are illustrated or implied through the descriptions of the embodiments below.

Figure 1A:
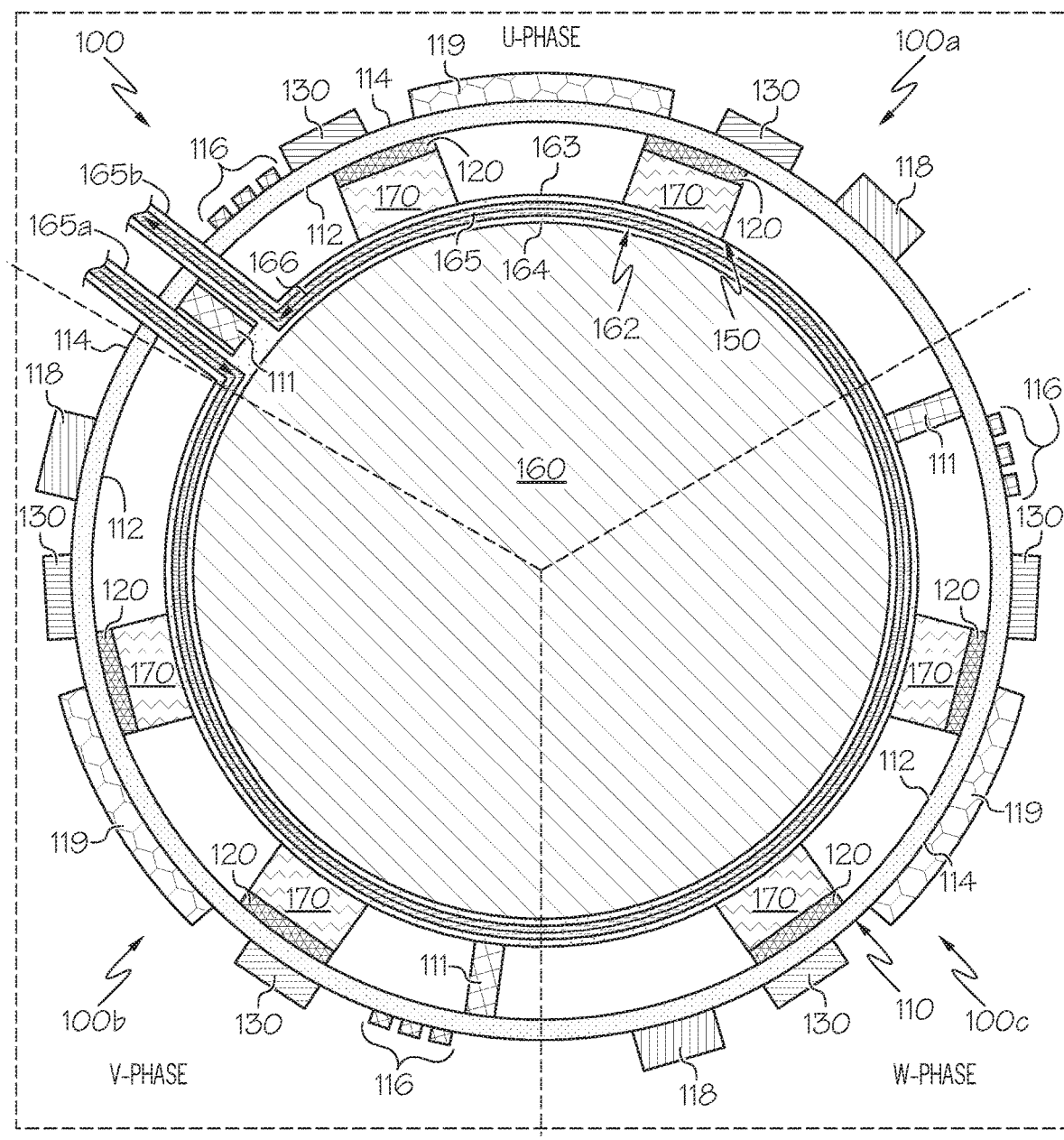
FIG. 1A depicts a side cross-sectional view of an electronic assembly circumferentially mounted around a motor using a flexible substrate and integrated with a thermal management assembly having a thermal compensation base layer that includes a thermally conductive mount made of a metal or an alloy, according to one or more embodiments shown and described herein.
Figure 1B:
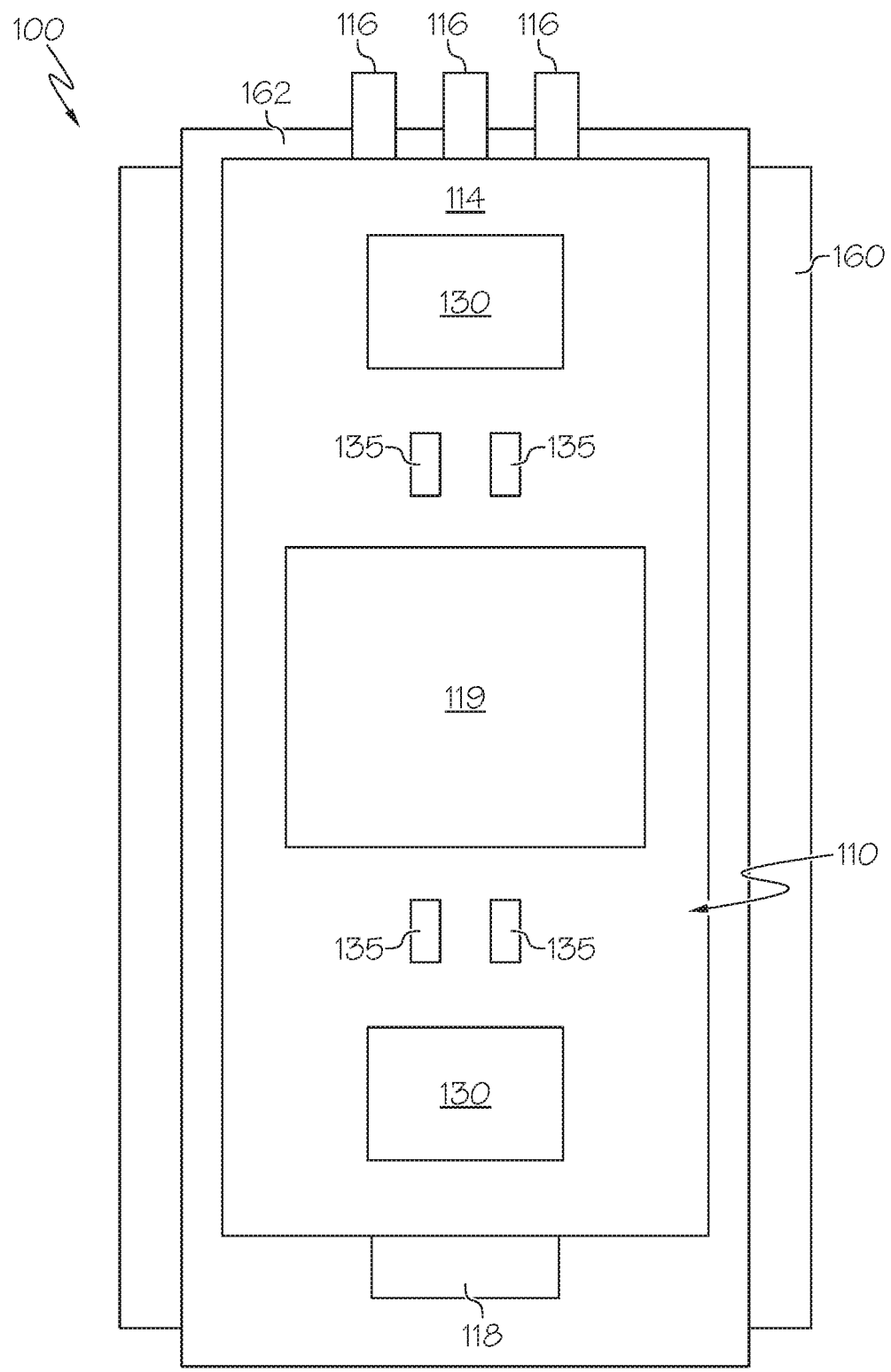
FIG. 1B depicts a top view of the electronic assembly of FIG. 1A, according to one or more embodiments shown and described herein.
Figure 1C:
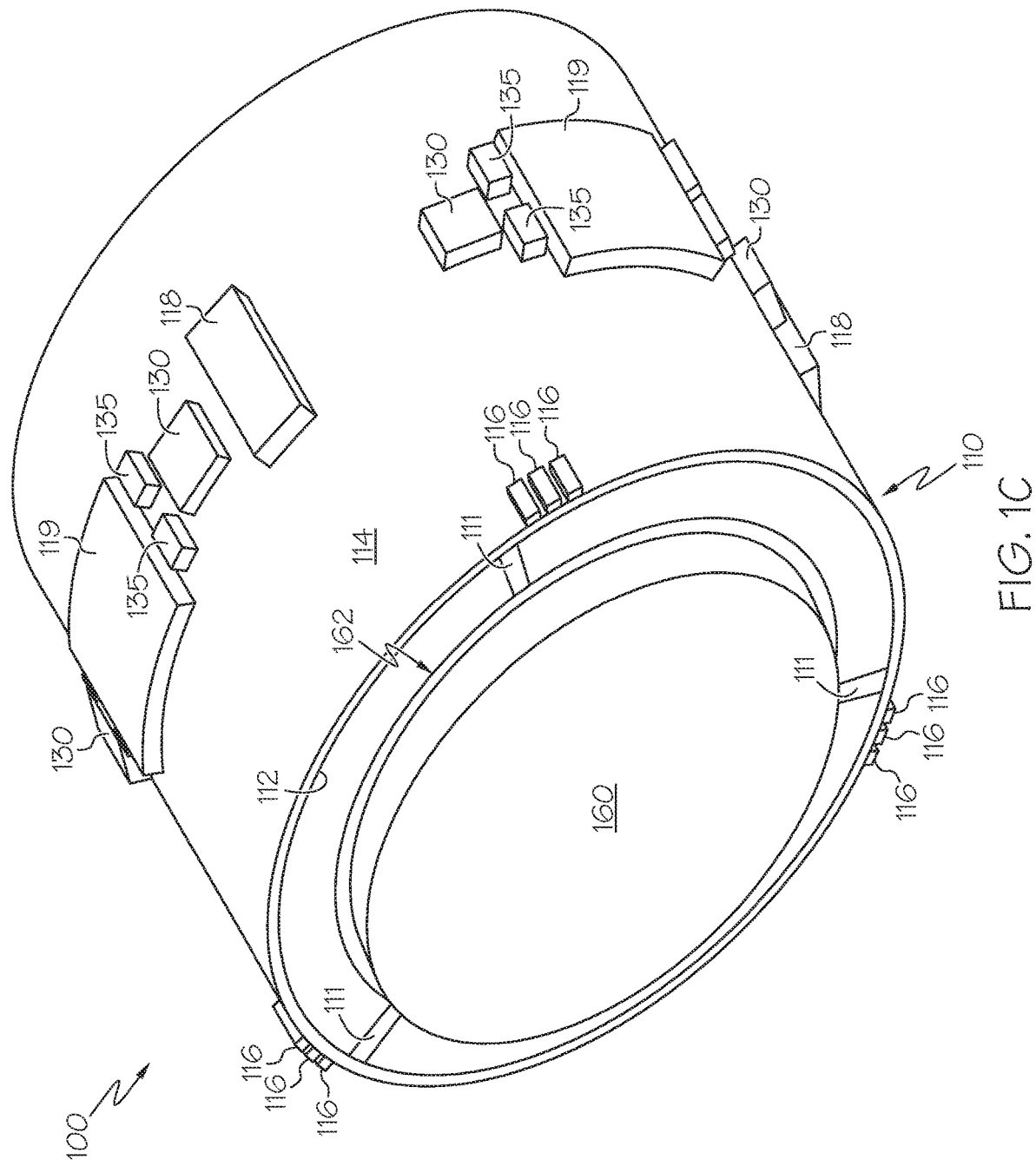
FIG. 1C depicts a perspective view of the electronic assembly of FIG. 1A, according to one or more embodiments shown and described herein.

FIG. 1A depicts a side cross-sectional view of an example electronic assembly 100 circumferentially mounted around a motor 160 and integrated with an example thermal management assembly 150. The thermal management assembly 150 is thermally connected to a flexible PCB 110 of the example electronic assembly 100. FIGS. 1B and 1C depict a top view and a perspective view of the example electronic assembly 100 shown in FIG. 1A. As used herein, the term "flexible" is defined as being capable of being bent in a circular fashion around an entire circumference of a cylindrical-shaped object.

Figure 4:
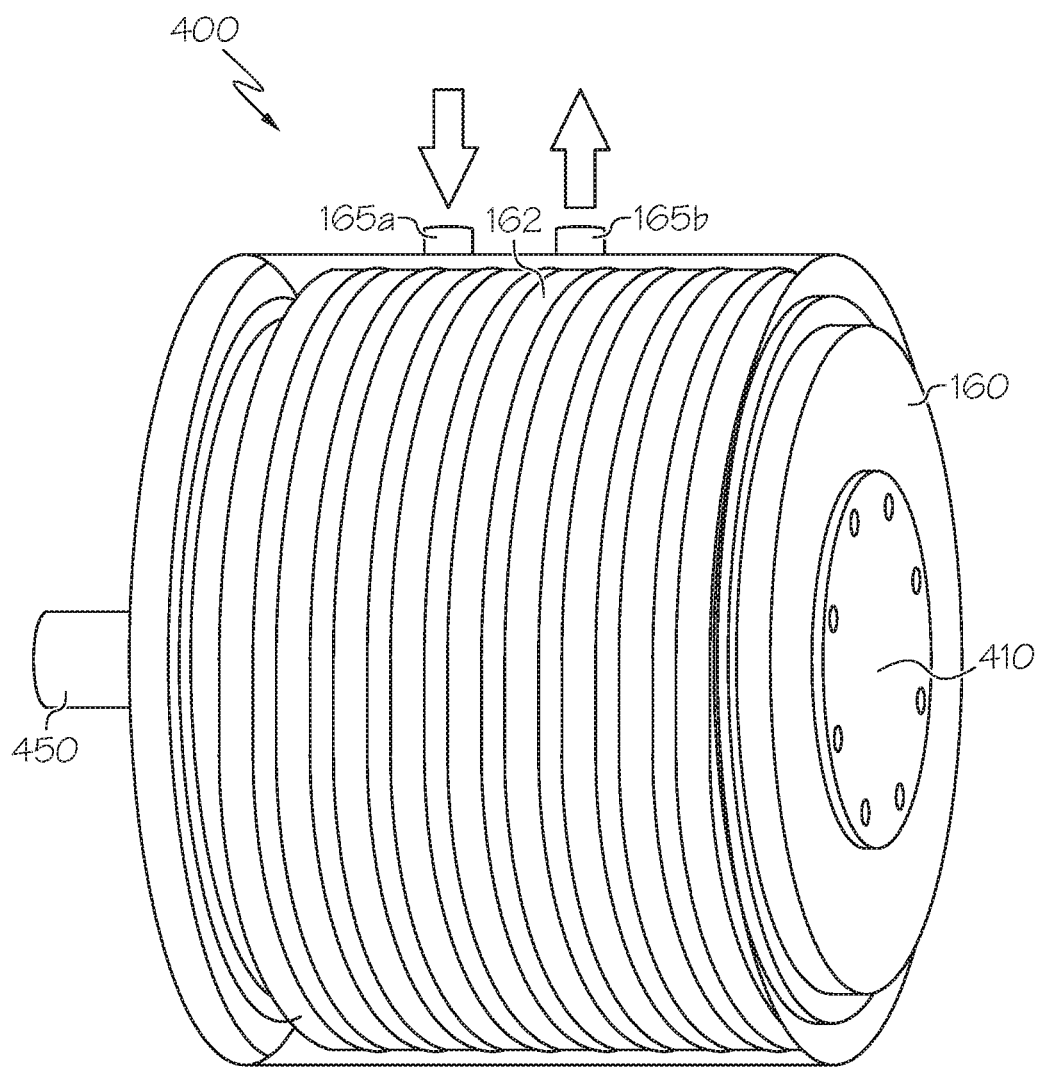
FIG. 4 depicts a perspective view of an electric motor having a cooling jacket wrapped around its circumference, according to one or more embodiments shown and described herein.

The thermal management assembly 150 includes, among other components, a cylindrical cooling jacket 162 mounted around a circumference of the motor 160, as shown in FIGS. 1A, 1C and 4. FIG. 4 shows a perspective view of an assembly 400 of the motor 160 having the cooling jacket 162 wrapped around its circumference. The motor 160 has a stator 410 and a rotor shaft 450. FIGS. 1A and 1C show further details of the cooling jacket 162.

The example cooling jacket 162 has a top surface 163 and a bottom surface 164, both of which are concentric with the circumference of the motor 160. The top surface 163 of the cooling jacket 162 may be a mounting surface to which the flexible PCB 110 is mounted. The cooling jacket 162 has a jacket manifold 165 disposed between a fluid inlet 165a and a fluid outlet 165b. The cooling jacket 162 is formed from any suitable material such as, but not limited to, copper, aluminum, or nickel.

The flexible PCB 110 is circumferentially disposed around the motor 160 and configured as a substrate on which electronic devices can be disposed. The flexible PCB 110 is made of a flexible ceramic material such as, but not limited to, Alumina Ribbon Ceramic® by Corning, Inc. The Alumina Ribbon Ceramic® is an ultra-thin (about 14 micron thickness), flexible ceramic substrate having high thermal conductivity and high dielectric breakdown strength that enables electrical isolation between power electronic device(s) and the gate drive(s) disposed on the flexible PCB 110.

The Alumina Ribbon Ceramic® material can be bent in a circular fashion around the entire circumference of the motor 160 to form the flexible PCB 110. The flexible PCB 110 has a top surface 114 and a bottom surface 112. The bottom surface 112 is coupled to the top surface 163 of the cooling jacket 162 proximate to the circumference of the motor 160. The flexible PCB 110 may have copper patterns on which electronic devices can be bonded.

In the non-limiting example embodiment shown in FIG. 1A, the electronic assembly 100 is configured as a three-phase inverter disposed on the flexible PCB 110. The three-phase inverter converts DC voltage into three sinusoidal AC waves of equal amplitude in three different phases U, V, and W respectively using Pulse Width Modulation (PWM). The electronic assembly 100 configured as a three-phase inverter includes three switching circuits 100a, 100b, 100c disposed on the flexible PCB 110 at an angle of a hundred and twenty apart from each other. The switching circuit 100a produces the U-Phase AC output, the switching circuit 100b produces the V-Phase AC output, and the switching circuit 100c produces the W-Phase AC output.

Individual switching circuits 100a, 100b, 100c include one or more switching devices 120 (alternatively referred as 'the power electronic device(s)') disposed on the bottom surface 112 of the flexible PCB 110 and one or more gate drive devices 130 disposed on the top surface 114 of the flexible PCB 110. The one or more gate drive devices 130 are operable to control the switching device(s) 120. Individual switching circuits 100a, 100b, 100c further includes an electrically conductive post 111 positioned between the flexible PCB 110 for phase connection and the motor 160. Accordingly, the flexible PCB 110 includes three electrically conductive posts 111 for electrically coupling the one or more switching devices 120 to the motor 160. In some non-limiting embodiments, phase wiring cables may be used instead of the electrically conductive posts 111.

Individual switching circuits 100a, 100b, 100c may also include a capacitor 119 disposed on the top surface 114 of the flexible PCB 110 and configured to be electrically connected to a battery (not shown). Accordingly, the three capacitors 119 on the flexible PCB 110 are operable to smoothen and balance any voltage oscillations from the battery such that the switching device(s) 120 can operate optimally to produce AC output. In some embodiments, the electronic assembly 100 may further include at least an additional switching circuit disposed on the flexible PCB 110, similar to the switching circuits 100a, 100b, 100c and configured to produce an additional or alternative AC output for redundancy.

The one or more switching devices 120 mounted on the bottom surface 112 of the flexible PCB 110 are one or more active components. In some embodiments, the switching devices 120 are mounted using a flip chip ball grid array arrangement comprising a plurality of solder balls made from a high temperature silver or an alloy made of high temperature silver. In other embodiments, the switching devices 120 can be mounted by other means. In some embodiments, an underfill material may be provided around the plurality of solder balls for enhanced stability of the mounted the switching devices 120. The switching devices 120 may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the switching devices 120 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the switching devices 120 operate at high current and under high temperatures, for example in excess of 250° C. and generate a large amount of heat that must be removed for the continued operation of the electronic assembly 100. A power terminal 116 having positive and negative output is coupled to the top surface 114 of the flexible PCB 110.

In some embodiments as shown in FIGS. 1A-1C, the one or more gate drive devices 130 may be bonded to the top surface 114 of the flexible PCB 110 via a bonding layer such as, but not limited to, a solder layer or a transient liquid phase (TLP) bonding layer. However, in other embodiments, the one or more gate drive devices 130 may be bonded to the bottom surface 112 of the flexible PCB 110. The gate drive device(s) 130 are one or more active components. The gate drive devices 130 are configured to control the operation of the switching devices 120 and may be coupled to one or more passive components 135 such as, but not limited to, capacitor(s), resistor(s), transformer(s) and inductor(s). A signal connector 118 configured to connect with a signal controller (not shown) is disposed on the top surface 114 of the flexible PCB 110.

The switching devices 120 are thermally coupled (for example, via mechanical connection) to a thermal compensation base layer 170, which is thermally coupled to the cooling jacket 162 disposed around a circumference of the motor 160. Thus, the thermal compensation base layer 170 thermally connects the switching devices 120 to the cooling jacket 162. In some embodiments, such as that shown in FIG. 1A, the thermal compensation base layer 170 is a thermally conductive mount made of copper, aluminum, nickel, and/or alloys thereof.

In the example embodiment shown in FIG. 1A, the cooling jacket 162 has the jacket manifold 165 formed through the cooling jacket 162. In other embodiments, the cooling jacket 162 may have more than one jacket manifold 165. In the embodiment shown in FIG. 1A, a cooling fluid flows through the jacket manifold 165 in a circular direction 166 around the circumference of the motor 160 between the fluid inlet 165a and the fluid outlet 165b, defining a fluid flow area therebetween. The cooling fluid is configured to absorb and transfer heat generated from the operation of the electronic assembly 100 as well as the motor 160. The cooling fluid may be air, an electrically conductive fluid, such as an ethylene glycol mixture, water, etc. or a dielectric cooling fluid that undergoes single-phase cooling. In some embodiments, the cooling fluid may undergo two-phase cooling by transforming from a liquid phase to a vapor phase.

The cooling fluid entering the jacket manifold 165 at the fluid inlet 165a is directed to flow, for example by a pump (not shown), through the jacket manifold 165 and flows in the circular direction 166 around the motor 160 before it finally exits through the fluid outlet 165b. The cooling jacket 162 with the jacket manifold 165 and the thermal compensation base layer 170 comprise the thermal management assembly 150. Heat generated during operation of the electronic assembly 100 is removed through the thermal compensation base layer 170 into the cooling fluid flowing through the jacket manifold 165, as described above. The thermal management assembly 150 is thermally connected to the flexible PCB 110 and thus configured to remove heat from the electronic assembly 100 at high operating temperatures, for example in excess of 250° C.

Figure 2:
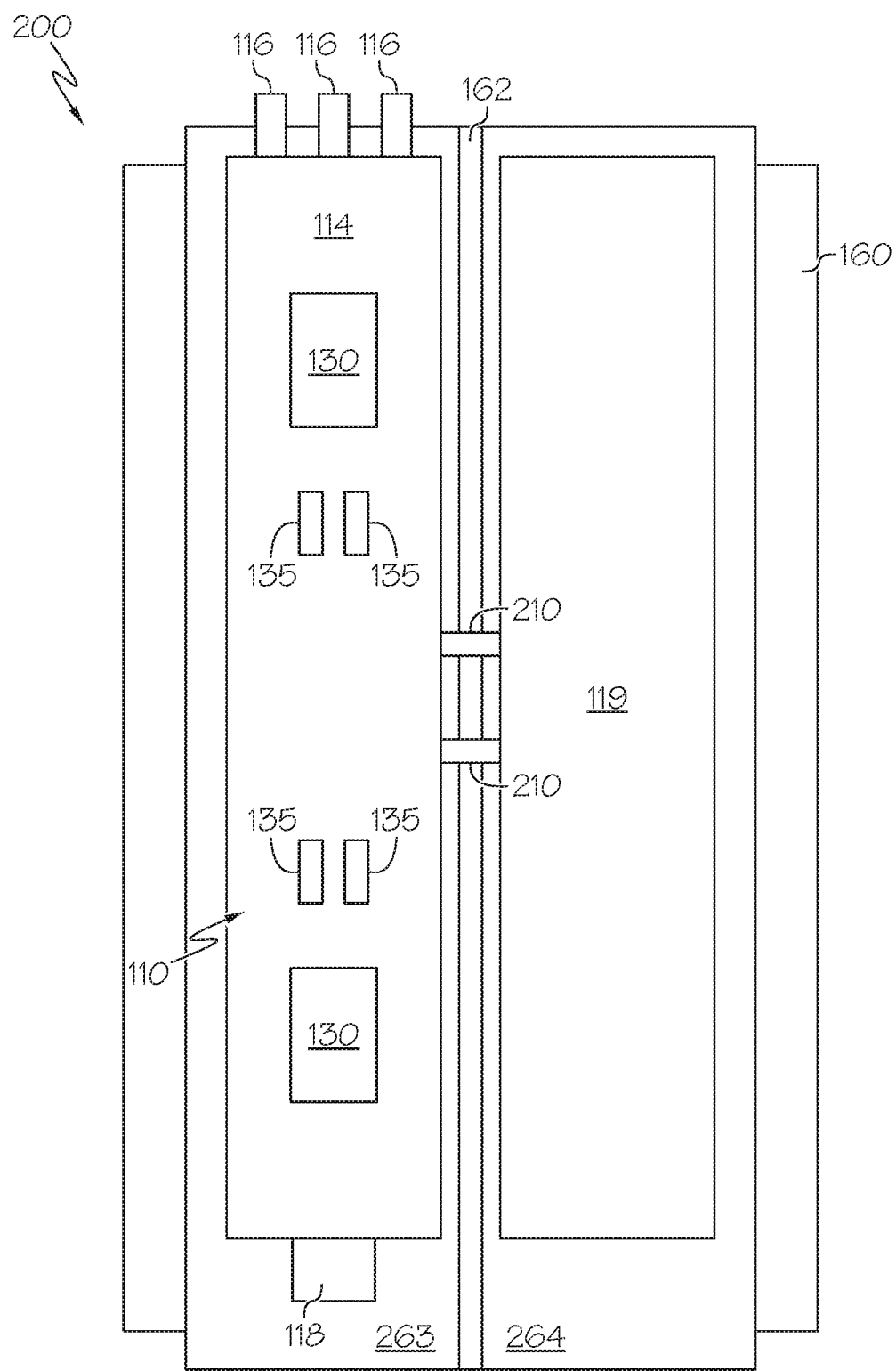
FIG. 2 depicts a top view of another embodiment of the electronic assembly of FIG. 1A, where a capacitor is disposed on a separate mounting surface from the mounting surface of the flexible printed circuit board of the electronic assembly, according to one or more embodiments shown and described herein.

FIG. 2 depicts a top view of another embodiment of an electronic assembly 200 of FIG. 1A, where the cooling jacket 162 has two mounting surfaces 263 and 264, both of which are concentric with the circumference of the motor 160. The flexible PCB 110 is disposed on the mounting surface 263 and includes the gate drive devices 130, the passive components 135, the power terminal 116 and the signal connector 118 for each of the switching circuits 100a, 100b, and 100c disposed thereon. The capacitor 119 for each of the switching circuits 100a, 100b, and 100c may be disposed on the mounting surface 264 and electrically connected to the flexible PCB 110 via electrical connectors 210. The capacitor 119 is configured to be electrically connected to a battery (not shown).

Figure 3:
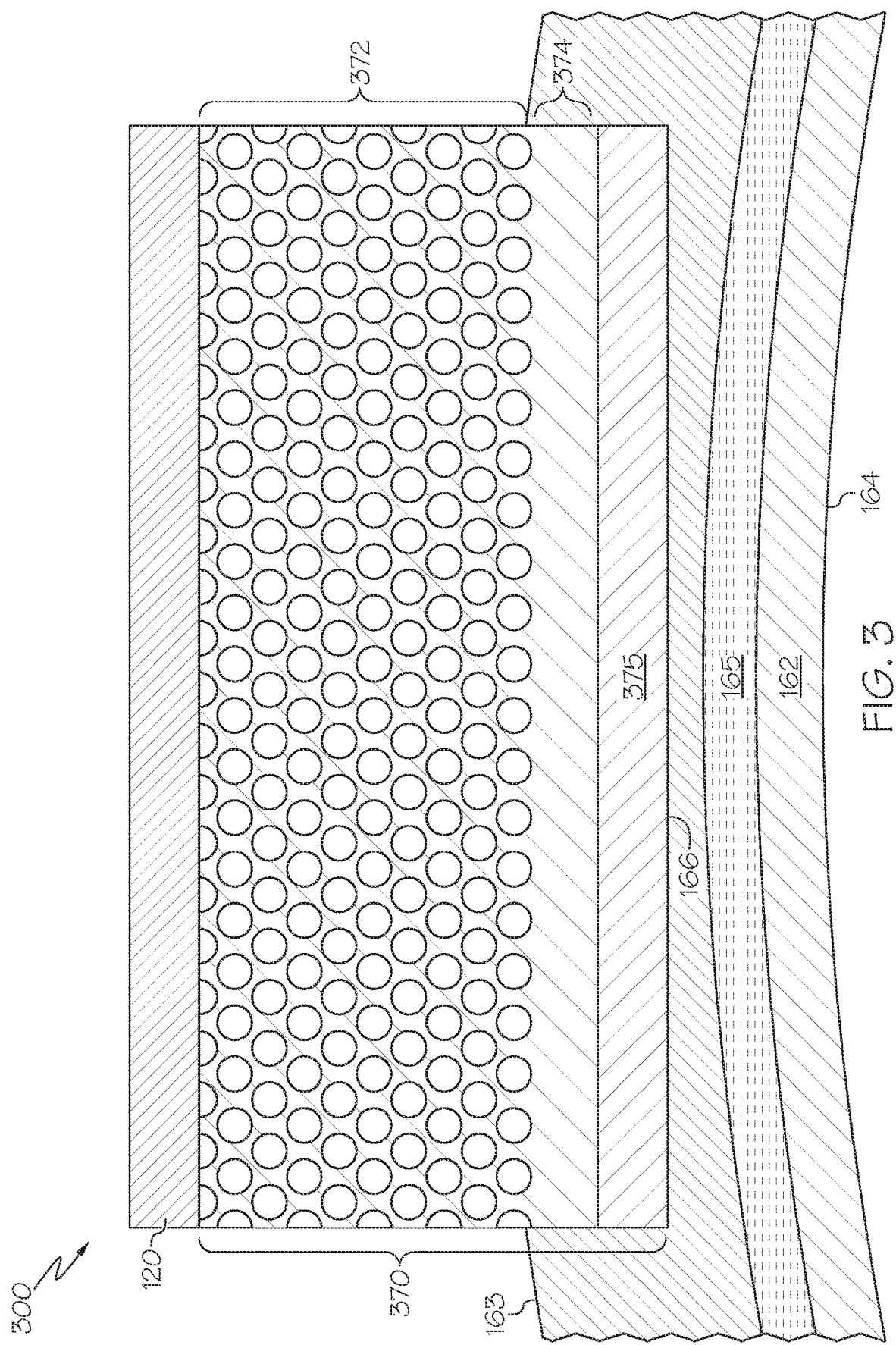
FIG. 3 depicts a side cross-sectional view of another embodiment of the thermal compensation base layer of FIG. 1A having a metal inverse opal (MIO) structure, according to one or more embodiments shown and described herein.

FIG. 3 depicts a side cross-sectional view of another embodiment of a thermal compensation base layer 370 of an electronic assembly 300. The thermal compensation base layer 370 is bonded to the switching device 120 and thermally couples the switching device 120 to the cooling jacket 162. The cooling jacket 162 has a slot 166 on the top surface 163, i.e. the mounting surface to accommodate the thermal compensation base layer 370. The thermal compensation base layer 370 of FIG. 3 has a metal inverse opal (MIO) structure 372 and a cap layer 374 overgrown on the MIO structure 372. The thermal compensation base layer 370 further includes an electrically insulating layer 375 disposed between the cap layer 374 and the slot 166 on the cooling jacket 162. The electrically insulating layer 375 is formed from a metal oxide, a polymer, a polyamide, or a ceramic material. In a non-limiting example, the metal oxide may be copper oxide. The thermal compensation base layer 370 may be used as an alternative to any or all of the thermal compensation base layers 170 in FIG. 1A.

The MIO structure 372 includes any inverse opal structure, such as, for example, a copper inverse opal (CIO) structure, a nickel inverse opal (NIO) structure, or other inverse opal structure made from, without limitation, aluminum, silver, zinc, magnesium, or alloys thereof. The MIO structure 372 is an integrated metal porous structure that provides a combination of large surface-to-volume ratio, high conductivity, and mechanical compliance and thus can improve heat dissipation from the electronic assembly 100. The MIO structure 372 can also provide thermal stress relief due to mismatch in the coefficient of thermal expansion (CTE) with the components of the electronic assembly 100. The cap layer 374 is formed by further deposition of the corresponding metal of the MIO structure 372, i.e. copper, nickel, etc. over the inverse opal structure of MIO structure 372.

The thermal management assemblies described herein can be advantageously used as a thermal management solution for electronic assemblies circumferentially mounted around a motor using a flexible substrate to address high heat flux applications. In vehicular applications, especially for the power electronic assemblies used as inverters in electric vehicles, this enables the electronic assemblies to be maintained within a suitable operating temperature range. The structures of the electronic assemblies described herein significantly reduces packaging size of electronic assemblies by combining the both the power electronic device(s) and the gate drive device(s) into a single package. Power electronic device(s) can be integrated with the gate drive device(s) into a single compact package without interfering with the signal interaction between the power electronic device(s) and the gate drive device(s), while cooling the electronic assemblies at the same time. Finally, since the gate drive device(s) are positioned closer to the power electronic device(s), parasitic inductance is reduced.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A thermal management assembly for cooling an electronic assembly on a flexible printed circuit board circumferentially disposed around a motor, the thermal management assembly comprising:
   a cooling jacket configured to be mounted around a circumference of the motor, the cooling jacket having a mounting surface concentric with the circumference of the motor;
   at least one jacket manifold formed through the cooling jacket, the at least one jacket manifold having a fluid inlet and a fluid outlet and defining a fluid flow area therebetween; and
   a thermal compensation base layer thermally coupled to the cooling jacket and configured to thermally connect the cooling jacket and one or more devices on the flexible printed circuit board.

2. The thermal management assembly of claim 1, wherein the cooling jacket is formed from one or more of the following: copper, aluminum, and nickel.

3. The thermal management assembly of claim 1, wherein the thermal compensation base layer is formed from one or more of the following: copper, aluminum, nickel, and alloys thereof.

4. The thermal management assembly of claim 1, wherein the thermal compensation base layer comprises:
   a metal inverse opal (MIO) structure;
   a cap layer overgrown on the MIO structure; and
   an electrically insulating layer disposed between the cap layer and the cooling jacket, the electrically insulating layer comprising a metal oxide, polymer, polyimide, or a ceramic material.

5. The thermal management assembly of claim 1, wherein the mounting surface of the cooling jacket is configured with a slot to accommodate the thermal compensation base layer coupled to each of the one or more devices on the flexible printed circuit board.

6. The thermal management assembly of claim 1 further comprising a cooling fluid flowing in the fluid flow area, the cooling fluid comprising one or more of the following: air, water, ethylene glycol mixture, a single-phase coolant, a two-phase coolant, and an electrically conductive coolant.

7. An electronic assembly comprising:
   a flexible printed circuit board circumferentially disposed around a motor and having a first surface and a second surface opposite to the first surface;
   one or more switching semiconductor devices disposed on the first surface; and
   a thermal management assembly thermally connected to the flexible printed circuit board, the thermal management assembly comprising:
      a cooling jacket mounted around a circumference of the motor and having a mounting surface concentric with the circumference of the motor, the mounting surface coupled to the first surface of the flexible printed circuit board;
      at least one jacket manifold formed through the cooling jacket, the at least one jacket manifold having a fluid inlet and a fluid outlet and defining a fluid flow area therebetween; and
      a thermal compensation base layer thermally coupled to the cooling jacket and the one or more switching semiconductor devices disposed on the first surface of the flexible printed circuit board.

8. The electronic assembly of claim 7 further comprising:
   one or more gate drive devices disposed on the second surface and operable to control the one or more switching semiconductor devices.

9. The electronic assembly of claim 7, wherein the one or more switching semiconductor devices are formed from one or more of the following: silicon carbide (SiC), silicon dioxide ($SiO_2$), aluminum nitride (AlN), gallium nitride (GaN), and boron nitride (BN).

10. The electronic assembly of claim 7, wherein the flexible printed circuit board comprises a flexible ceramic material.

11. The electronic assembly of claim 7, wherein the cooling jacket is formed from one or more of the following: copper, aluminum, and nickel.

12. The electronic assembly of claim 7, wherein the thermal compensation base layer is formed from one or more of the following: copper, aluminum, nickel, and alloys thereof.

13. The electronic assembly of claim 7, wherein the thermal compensation base layer comprises:
   a metal inverse opal (MIO) structure;
   a cap layer overgrown on the MIO structure; and
   an electrically insulating layer disposed between the cap layer and the cooling jacket, the electrically insulating layer comprising a metal oxide, polymer, polyamide, or a ceramic material.

14. The electronic assembly of claim 7 further comprising:
   one or more capacitors disposed on the printed circuit board and configured to be electrically connected to a battery.

15. The electronic assembly of claim 7, wherein:
   the cooling jacket further comprises a second mounting surface concentric with the circumference of the motor; and
   one or more capacitors disposed on the second mounting surface, the one or more capacitors individually configured to be electrically connected to a battery.

16. The electronic assembly of claim 7, wherein the mounting surface of the cooling jacket comprises a slot to accommodate the thermal compensation base layer coupled to each of the one or more switching semiconductor devices.

17. The electronic assembly of claim 7, wherein the one or more switching semiconductor devices are electrically coupled to the motor through electrically conductive posts positioned between the printed circuit board and the motor.

18. The electronic assembly of claim 7 configured as a three-phase inverter and comprising three switching circuits disposed on the flexible printed circuit board around the circumference of the motor, wherein an individual switching circuit comprises:
- one or more switching semiconductor devices disposed on the first surface of the flexible printed circuit board;
- one or more gate drive devices disposed on the second surface of the flexible printed circuit board and operable to control the one or more switching semiconductor devices;
- an electrically conductive post positioned between the flexible printed circuit board and the motor; and
- a capacitor configured to be electrically connected to a battery.

19. The electronic assembly of claim 7, wherein the thermal management assembly further comprises a cooling fluid flowing in the fluid flow area, the cooling fluid comprising one or more of the following: air, water, ethylene glycol mixture, a single-phase coolant, a two-phase coolant, and an electrically conductive coolant.

* * * * *